(12) United States Patent
Li

(10) Patent No.: US 10,710,876 B2
(45) Date of Patent: Jul. 14, 2020

(54) QUANTUM DOT GLASS PLATE AND MANUFACTURING METHOD THEREOF

(71) Applicant: Shenzhen China Star Optoelectronics Technology Co., Ltd., Shenzhen (CN)

(72) Inventor: Quan Li, Shenzhen (CN)

(73) Assignee: Shenzhen China Star Optoelectronics Technology Co., ltd., Shenzhen (CN)

( * ) Notice: Subject to any disclaimer, the term of this patent is extended or adjusted under 35 U.S.C. 154(b) by 420 days.

(21) Appl. No.: 15/303,033

(22) PCT Filed: May 23, 2016

(86) PCT No.: PCT/CN2016/082953
§ 371 (c)(1),
(2) Date: Oct. 10, 2016

(87) PCT Pub. No.: WO2017/181473
PCT Pub. Date: Oct. 26, 2017

(65) Prior Publication Data
US 2017/0334716 A1    Nov. 23, 2017

(30) Foreign Application Priority Data
Apr. 21, 2016  (CN) .......................... 2016 1 0255276

(51) Int. Cl.
| | |
|---|---|
| *B82B 1/00* | (2006.01) |
| *B32B 17/06* | (2006.01) |
| *B32B 7/14* | (2006.01) |
| *B82Y 20/00* | (2011.01) |
| *H01L 33/50* | (2010.01) |
| *B82Y 40/00* | (2011.01) |
| *G09F 9/33* | (2006.01) |
| *B32B 5/00* | (2006.01) |
| *F21V 9/30* | (2018.01) |
| *B82Y 30/00* | (2011.01) |

(52) U.S. Cl.
CPC .............. *B82B 1/001* (2013.01); *B32B 5/00* (2013.01); *B32B 7/14* (2013.01); *B32B 17/06* (2013.01); *B82Y 20/00* (2013.01); *B82Y 40/00* (2013.01); *F21V 9/30* (2018.02); *G09F 9/33* (2013.01); *H01L 33/505* (2013.01); *B32B 2457/20* (2013.01); *B82Y 30/00* (2013.01)

(58) Field of Classification Search
CPC ..................................................... B32B 17/06
USPC ....................................................... 428/195.1
See application file for complete search history.

(56) References Cited

U.S. PATENT DOCUMENTS

| | | | |
|---|---|---|---|
| 3,843,472 A * | 10/1974 | Toussaint | ................. B24B 9/10 |
| | | | 428/192 |
| 2017/0279247 A1* | 9/2017 | Logunov | ........... G02F 1/133603 |
| 2017/0299792 A1* | 10/2017 | Oh | ............................. F21V 9/30 |

* cited by examiner

*Primary Examiner* — Ian A Rummel

(57) ABSTRACT

A quantum dot glass plate includes a first glass substrate, a second glass substrate correspondingly parallel with the first glass substrate, and a glue layer arranged between the first glass substrate and the second glass substrate, where the glue layer includes at least one glue frame arranged in a line. A shape of the first glass substrate is same as a shape as the second glass substrate, and edges of the glue layer correspond to edges of the first glass substrate and the second glass substrate.

5 Claims, 2 Drawing Sheets

QUANTUM DOT GLASS PLATE AND MANUFACTURING METHOD THEREOF

RELATED APPLICATIONS

This application is a National Phase of PCT Patent Application No. PCT/CN2016/082953 having International filing date of May 23, 2016, which claims the benefit of priority of Chinese Patent Application No. 201610255276.3 filed on Apr. 21, 2016. The contents of the above applications are all incorporated by reference as if fully set forth herein in their entirety.

FIELD AND BACKGROUND OF THE INVENTION

The present disclosure relates to the field of display device technology, and more particularly to a quantum dot glass plate and a manufacturing method thereof.

Quantum dots are based on semiconducting crystals, where size of the quantum dot ranges from 1 to 100 nanometers, and each particle of the quantum dot is a monocrystal. An advantage of the quantum dots is based on quantum confinement effect of the semiconducting crystal or quantum size effect of the semiconducting crystal. When size of the semiconducting crystal reaches nanoscale levels (1 nanometer is approximately equal to ten thousandth of human hair), different sizes of the semiconducting crystal can emit different color light. Therefore, for new materials, quantum dots are widely used in electronics, such as lighting devices, mobile devices, and television devices.

At present, lighting principle of a common white light emitting diode (LED) is that a blue LED excites yellow fluorescent powder, where a color gamut saturation value (National Television System Committee (NTSC) value) of the common white light emitting diode is between approximately 60-80%. A traditional blue light emitting diode excites nanoscale-sized quantum dots, which makes NTSC value reach 100% or more, further improving display quality of a panel. However, packaging of the quantum dots is an important topic in current research. Traditional packaging puts the quantum dots in a glass tube, but this manufacturing procedure is complicated, and non-effective zone of sealing location of the glass tube is big and occupies extra space, which negatively impacts a narrow frame design principle. In narrow frame designs, the surface area of periphery elements of the glass plate (namely portion of sub-frame cannot display) should be as small as possible. Therefore, it is important to how to ensure effect of the packaging of the quantum dots in advance and reduce the non-effective zone (non-display zone) as much as possible.

SUMMARY OF THE INVENTION

The aim of the present disclosure is to solve problems of the prior art, such as: large spaces of the glass tube not to be effectively sealed, a narrow frame design philosophy is difficult to achieve, and manufacturing procedure is complicated.

In order to achieve the aim of the present disclosure, the present disclosure provides a quantum dot glass plate, where the quantum dot glass plate comprises a first glass substrate, a second glass substrate correspondingly parallel with the first glass substrate, and a glue layer arranged between the first glass substrate and the second glass substrate. Shapes of the first glass substrate and the second glass substrate are same. Edges of the glue layer correspond to edges of the first glass substrate and the second glass substrate. The glue layer comprises at least one glue frame arranged in a line, and the glue frames are arranged side by side. Each of the glue frames comprises at least three edge sub-frames, and heads and tails of at least three edge sub-frames are successively connected with each other. Quantum dots are uniformly distributed in each of the glue frames.

The shapes and sizes of the first glass substrate and the second glass substrate are same, and shapes and sizes of at least one or more glue frames arranged in same glue layer are same. The glue frame is rectangular ring structure. Width of the edge sub-frame is from 0.1 mm to 1 mm. Distance between any two adjacent glue frames ranges from 0.1 mm to 0.5 mm. Distance from the edge of the glue layer to the edge of the first glass substrate ranges from 0.1 mm to 0.5 mm.

In order to achieve the aim of the present disclosure, the present disclosure provides a manufacturing method for a quantum dot glass plate comprising following steps:

providing a first glass substrate and a second glass substrate that is correspondingly parallel with the first glass substrate;

arranging a glue layer in a surface of a first side of the first glass substrate; the first side of the first glass substrate faces the second glass substrate; an edge of the glue layer is corresponding to an edge of the first glass substrate, the glue layer comprises at least one glue frame arranged in a line, and the glue frames are arranged side by side; each of the glue frame comprises at least three edge sub-frames, and heads and tails of at least three edge sub-frames are successively connected with each other;

coating the quantum dots in each of the glue frames;

attaching the second glass substrate to the first glass substrate by the glue layer;

curing the glue layer to form a complex glass plate;

cutting the complex glass plate into at least one quantum dot glass plate along connecting position of the two adjacent glue frames;

smoothing edges of the quantum dot glass plate.

Advantages of the present disclosure are effectively packaging the nanoscale quantum dot, increasing the color gamut saturation value, improving display effect, largely decreasing the width of the non-effective zone of the quantum dot glass plate, and meeting the narrow frame design philosophy. The present disclosure cuts the complex glass plate into a plurality of the quantum dot glass plates according position of the glue frames, which improves production efficiency and decreases processing cost. The present disclosure simply upgrades equipment to achieve, which conveniently operates, improves flexibility, and decreases upgraded costs, further being suitable for large-scale promotion and application.

Figure 1:
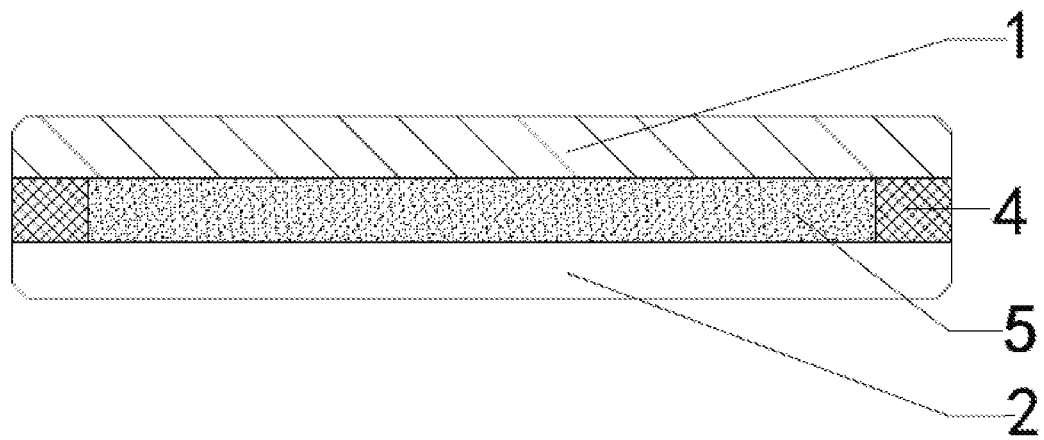
FIG. 1 is a sectional structural diagram of a quantum dot glass plate of the present disclosure.

Reference numbers of major elements of the drawings is as follow:

1. a first glass substrate 2. a second glass substrate 3. a glue layer 4. a glue frame 5. a quantum dot 41. a sub-frame 100. a quantum dot glass plate of the prior art 101. a first non-effective zone of the prior art 102. a second non-effective zone of the prior art 200. a quantum dot glass plate of the present disclosure 201. a first non-effective zone of the present disclosure 202. a second non-effective zone of the present disclosure

DESCRIPTION OF SPECIFIC EMBODIMENTS OF THE INVENTION

The following description of every embodiment with reference to the accompanying drawings is used to exemplify a specific embodiment, which may be carried out in the present invention. The embodiments completely introduce the present disclosure for person skilled in the art, which makes technology content clear and understand. The present disclosure embodies through different types of the embodiment. The protection range of the present disclosure is not limited in the embodiment of the present disclosure.

In the drawings, the components having similar structures are denoted by the same numerals. The structures and the components have similar function can use similar numerals to express. Thickness and size of each of the components of the drawings is randomly shown, the present disclosure does not limit thickness and size of each of the components of the drawings. In order to make the drawings clear, the thicknesses of some components in the drawings properly are increased.

When the first component is described as "arranged to the second component" or "connected to the second component", it should understand that the first component is directly arranged to the second component or the first component is directly connected to the second component, or it should understand that the first component is indirectly arranged to the second component via the third component or the first component is indirectly connected to the second component via the third component.

Figure 2:
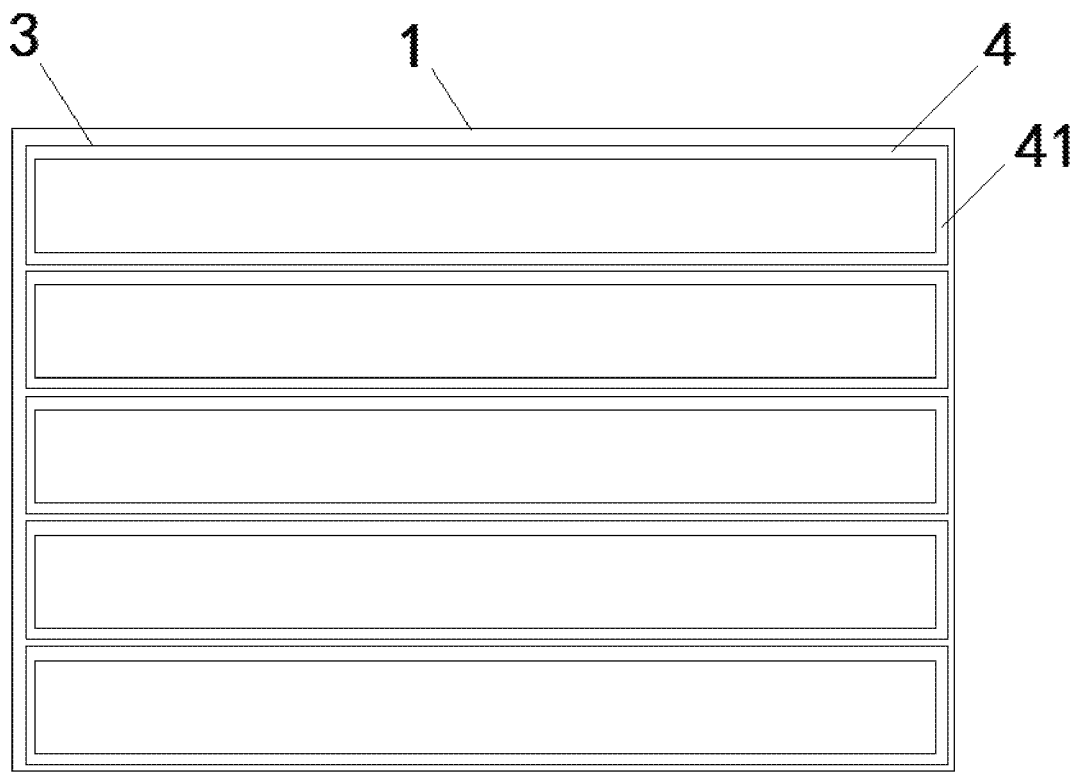
FIG. 2 is a distribution diagram of glue frames of a glue layer of the quantum dot glass plate of the present disclosure.

In FIG. 1 and FIG. 2, a quantum dot glass plate of the embodiment of the present disclosure comprises a first glass substrate 1 and a second glass substrate 2 correspondingly parallel with the first glass substrate 1, where a shape of the first glass substrate 1 is same as a shape as the second glass substrate 2, and size of the first glass substrate 1 is same as a size as the second glass substrate 2, and locations of the first glass substrate 1 and the second glass substrate 2 is corresponding.

The shape of the first glass substrate 1 is the same as the shape as the second glass substrate 2, and the size of the first glass substrate 1 is the same as the size as the second glass substrate, and shapes and sizes of a plurality of glue frames arranged in a same glue layer are same. The number of glue frames of the embodiment of the present disclosure is preferably five, where the glue frame is rectangular ring structure. The first glass substrate 1 and the second glass substrate 2 uses a specific strengthened glass, for example, the glass is chemically processed, which improves strength of the quantum dot glass plate.

A glue layer 3 of the embodiment of the first glass substrate 1 and the second glass substrate 2, where edges of the glue layer 3 correspond to edges of the first glass substrate 1 and the second glass substrate 2. Distance from the edge of the glue layer 3 to the edge of the first glass substrate 1 ranges from 0.1 mm to 0.5 mm, and the embodiment of the present disclosure preferably uses 0.3 mm.

The glue layer 3 comprises a plurality of the glue frames 4, where a plurality of the glue frames 4 are arranged side by side, and the embodiment of the present disclosure preferably uses five glue frames. The number of the glue frames 4 can be adjusted according to requirement. In the embodiment of the present disclosure, the glue frames 4 are formed by using glue to coat, and the glue frames 4 have the rectangular ring structure. The glue layer 3 and the glue frames 4 both use an ultraviolet light curing glue, an electron bean curing glue, or a heat curing glue. The quantum dots 5 are uniformly distributed in each of the glue frames 4. The quantum dots comprise but are not limited to copper indium diselenide material, copper indium gallium selenide material, or cadmium telluride material. Distance between any two adjacent glue frames 4 ranges from 0.1 mm to 0.5 mm, and the embodiment of the present disclosure preferably uses 0.5 mm, which is convenient for follow-up cutting operation, ensures good sealing performance of packaging of cut quantum dots, and makes the non-effective zone of cutting quantum dot glass plate smaller, further improving availability of the glass substrate.

Each of the glue frames comprises four edge sub-frames 41, where heads and tails of four edge sub-frames 41 are successively connected with each other, width of the edge sub-frame 41 ranges from 0.1 mm to 1 mm, and the embodiment of the present disclosure preferably uses 0.5 mm. Compared with prior art, the width of the edge sub-frame 41 is obviously smaller, which reduces the non-effective zone of the quantum got glass plate and improves availability of the glass substrate.

Figure 3:
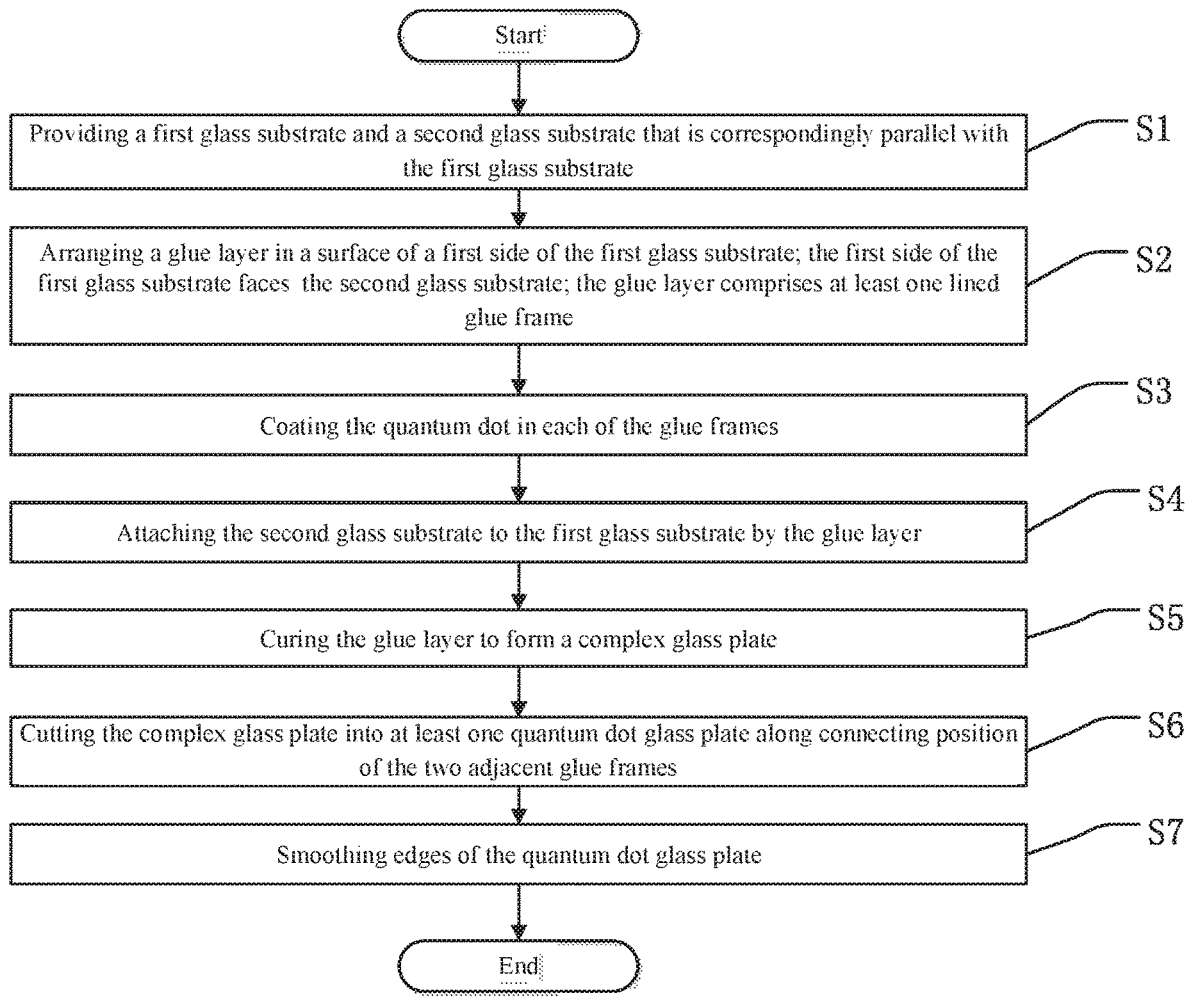
FIG. 3 is a flowchart of a manufacturing method for the quantum dot glass plate of the present disclosure.

In FIG. 3, a manufacturing method for the quantum dot glass plate comprises:

step 1 (S1): providing the first glass substrate and the second glass substrate that is correspondingly parallel with the first glass substrate. The first glass substrate and the second glass substrate uses specific strengthened glass, for example, the glass is chemically processed, which improves strength of the quantum dot glass plate.

step 2 (S2): arranging the glue layer in a surface of a first side of the first glass substrate, where the first side of the first glass substrate faces the second glass substrate. The edge of the glue layer corresponds to the edge of the first glass substrate, namely the edges of the glue layer, the first glass substrate, and the second glass substrate are in alignment. The glue layer comprises four the glue frames, where a plurality of the glue frames are arranged side by side, and the glue frame is the rectangular ring structure. Each of the glue frames comprises four edge sub-frames, where heads and tails of four edge sub-frames are successively connected with each other. The glue layer and the glue frames both use the ultraviolet light curing glue, the electron bean curing glue, or the heat curing glue. Distance between the edge of the glue layer and the edge of the first glass substrate ranges from 0.1 mm to 0.5 mm, and the embodiment of the present disclosure preferably uses 0.3 mm.

step 3 (S3): coating the quantum dots in each of the glue frames. The quantum dots are a name for a nanocrystal, where the quantum dot comprises nano-particles composed of category II-VI element or category III-V element. Particle size of the quantum dot ranges from 1 nm to 10 nm. The quantum dots have a wide excitation spectrum and a narrow excitation spectrum. Emission spectrum of the quantum dot is controlled by changing size of the quantum dot. Emission spectrum of the quantum dot can cover entire visible zone via changing the size of the quantum dot and chemical constitution of the quantum dot. The quantum dots comprise but are not limited to copper indium diselenide material, copper indium gallium selenide material, or cadmium telluride material.

step 4 (S4): attaching the second glass substrate to the first glass substrate by the glue layer, where the first glass substrate is closely attached to the second glass substrate by the glue layer.

step 5 (S5): curing the glue layer to form a complex glass plate, where curing process is according to a type of the glue of the glue layer to use curing method. If the glue layer is ultraviolet light curing glue, the curing method is the ultraviolet light curing method. If the glue layer is the electron bean curing glue, the curing method is the electron bean curing method. If the glue layer is the heat curing glue, the curing method is the heat curing method.

step 6 (S6): cutting the complex glass plate into at least one quantum dot glass plate along a connecting position of the two adjacent glue frames. Each of cutting line is at the connecting position of the two adjacent glue frames. The glue frames 4 is the rectangular ring structure, therefore, the quantum dots are well sealed.

step 7 (S7): smoothing edges of the quantum dot glass plate. Because edges of the cutting quantum dot glass plate have burrs, the edges of the cutting quantum dot glass plate are polished to be smooth.

Figure 4:
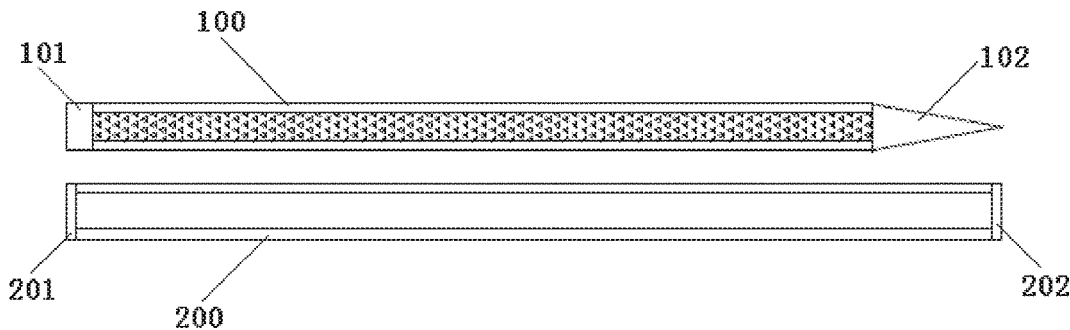
FIG. 4 is a comparison diagram between the cutting quantum dot glass plate of the present disclosure and the quantum dot glass plate of the prior art.

The proper quantum dot glass plate is made via the above-steps. The next step is packaging the quantum dot glass plate and achieves deliver goods In FIG. 4, the quantum dot glass plate 100 of the prior art comprises a first non-effective zone 101 of the prior art and a second non-effective zone 102 of the prior art. The quantum dot glass plate 200 of the present disclosure comprises a first non-effective zone 201 of the present disclosure and a second non-effective zone 202 of the present disclosure. The quantum dot glass plate 200 of the present disclosure and the quantum dot glass plate 100 of the prior art have same size, but have different structure. Widths of the non-effective zones of the present disclosure and widths of the non-effective zones of the prior art have obvious differences: the widths of the non-effective zones of the present disclosure is obviously smaller than the widths of the non-effective zones of the prior art, which makes effective zone of the quantum dot glass plate greater and meets narrow frame design principles.

Advantages of the present disclosure are effectively packaging the nanoscale quantum dot, increasing the color gamut saturation value, improving display effect, largely decreasing the width of the non-effective zone of the quantum dot glass plate, and having narrower frames. The present disclosure cuts the complex glass plate into a plurality of the quantum dot glass plates according position of the glue frames, which improves production efficiency and decreases processing cost. The present disclosure simply upgrades equipment to achieve, which conveniently operates, improves flexibility, and decreases upgraded costs, further being suitable for large-scale promotions and applications.

It should be understood that the present disclosure has been described with reference to certain preferred and alternative embodiments which are intended to be exemplary only and do not limit the full scope of the present disclosure as set forth in the appended claims.

What is claimed is:

1. A quantum dot glass plate, comprising
a first glass substrate;
a second glass substrate correspondingly parallel with the first glass substrate, and a shape of the first glass substrate is same as a shape as the second glass substrate;
a glue layer arranged between the first glass substrate and the second glass substrate, and edges of the glue layer correspond to edges of the first glass substrate and the second glass substrate, wherein the first glass substrate does not contact with the second glass substrate;
wherein the glue layer comprises at least one glue frame that are lined side by side;
wherein each of the glue frames comprises at least three edge sub-frames, and heads and tails of at least three edge sub-frames are successively connected with each other;
wherein quantum dots are uniformly distributed in each of the glue frames, the first glass substrate is attached to a first surface of the glue layer, the second glass substrate is attached to a second surface of the glue layer, wherein the first surface of the glue layer is opposite to the second surface of the glue layer;
wherein the quantum dots are selected from the group consisting of copper indium diselenide material, copper indium gallium selenide material, and cadmium telluride material;
wherein the quantum dots have a particle size ranging from 1 nm to 10 nm;
wherein a width of the edge sub-frame ranges from 0.1 mm to 1 mm, a distance between any two adjacent glue frames ranges from 0.1 mm to 0.5 mm, and a distance from the edge of the glue layer to the edge of the first glass substrate ranges from 0.1 mm to 0.5 mm; and
wherein the glue frame is a rectangular ring structure, and the glue frame surrounds a periphery of the glue layer.

2. The quantum dot glass plate as claimed in claim 1, wherein shapes and sizes of the first glass substrate and the second glass substrate are the same, and shapes and sizes of at least one or more glue frames arranged in the same glue layer are the same.

3. A manufacturing method for a quantum dot glass plate, comprising the following steps:
providing a first glass substrate and a second glass substrate that is correspondingly parallel with the first glass substrate;
arranging a glue layer in a surface of a first side of the first glass substrate, wherein the glue layer comprises a first surface and a second surface, the first surface of the glue layer is opposite to the second surface of the glue layer, the first side of the first glass substrate faces the second glass substrate, an edge of the first surface of the glue layer corresponds to an edge of the first glass substrate, the glue layer comprises at least one glue frame that are line side by side, and the glue frames are arranged side by side each of the glue frame comprises at least three edge sub-frames, and heads and tails of at least three edge sub-frames are successively connected with each other;
coating the quantum dots in each of the glue frames, wherein the glue frame surrounds a periphery of the glue layer, the quantum dots are selected from the group consisting of copper indium diselenide material, copper indium gallium selenide material, and cadmium telluride material, and the quantum dots have a particle size ranging from 1 nm to 10 nm;

attaching the second glass substrate to the second surface of the glue layer, wherein the second glass substrate does not contact with the first glass substrate;

curing the glue layer to form a complex glass plate;

cutting the complex glass plate into at least one quantum dot glass plate along connecting position of the two adjacent glue frames; and smoothing edges of the quantum dot glass plate, wherein a width of the edge sub-frame ranges from 0.1 mm to 1 mm, a distance between any two adjacent glue frames ranges from 0.1 mm to 0.5 mm, and a distance from the edge of the glue layer to the edge of the first glass substrate ranges from 0.1 mm to 0.5 mm.

4. The manufacturing method for the quantum dot glass plate as claimed in claim 3, wherein shapes and sizes of the first glass substrate and the second glass substrate are same, and shapes and sizes of at least one or more glue frames arranged in a same glue layer are same.

5. The manufacturing method for the quantum dot glass plate as claimed in claim 3, wherein the glue frame is a rectangular ring structure.

\* \* \* \* \*